United States Patent
Kang et al.

(10) Patent No.: US 9,952,366 B2
(45) Date of Patent: Apr. 24, 2018

(54) PATTERNING METHOD AND METHOD OF MANUFACTURING WIRE GRID POLARIZER USING THE SAME

(71) Applicant: Samsung Display Co. Ltd., Yongin (KR)

(72) Inventors: Min Hyuck Kang, Seoul (KR); Eun Ae Kwak, Gunpo-si (KR); Lei Xie, Suwon-si (KR); Moon Gyu Lee, Suwon-si (KR); Hyeong Gyu Jang, Busan (KR)

(73) Assignee: SAMSUNG DISPLAY CO. LTD., Gyeonggi-Do (KR)

( * ) Notice: Subject to any disclaimer, the term of this patent is extended or adjusted under 35 U.S.C. 154(b) by 171 days.

(21) Appl. No.: 14/628,985

(22) Filed: Feb. 23, 2015

(65) Prior Publication Data
US 2016/0077264 A1    Mar. 17, 2016

(30) Foreign Application Priority Data

Sep. 16, 2014   (KR) .................. 10-2014-0122863

(51) Int. Cl.
*G03F 7/00*   (2006.01)
*G02B 5/30*   (2006.01)

(52) U.S. Cl.
CPC .......... *G02B 5/3058* (2013.01); *G03F 7/0002* (2013.01)

(58) Field of Classification Search
CPC ............ C08G 2261/74; H01L 21/3081; H01L 21/31058
USPC ....................................................... 430/325
See application file for complete search history.

(56) References Cited

U.S. PATENT DOCUMENTS

| 8,653,211 | B2 | 2/2014 | Kang et al. |
| 9,268,075 | B1* | 2/2016 | Yoon ................ G02B 5/3058 |
| 9,354,522 | B2* | 5/2016 | Kang ..................... G03F 7/40 |

FOREIGN PATENT DOCUMENTS

| KR | 1020100068014 | 6/2010 |
| KR | 1020130034778 | 4/2013 |
| KR | 1020140030873 | 3/2014 |
| KR | 1020150072663 | 6/2015 |
| KR | 1020150089708 | 8/2015 |
| KR | 1020150092397 | 8/2015 |

OTHER PUBLICATIONS

P. Mansky, et al., "Controlling Polymer-Surface Interactions with Random Copolymer Brushes", Science, vol. 275, No. 5305, Mar. 7, 1997, pp. 1458-1460.
Sujin Ham, et al., "Microdomain Orientation of PS-b-PMMA by Controlled Interfacial Interactions", Macromolecules vol. 41, 6431, (2008).

* cited by examiner

*Primary Examiner* — Daborah Chacko Davis
(74) *Attorney, Agent, or Firm* — Cantor Colburn LLP

(57) ABSTRACT

A patterning method includes forming guide layer patterns, which are separated from each other, on a top surface of a base substrate, forming a neutral layer, which includes a random copolymer comprising first blocks or second blocks, on an entirety of the top surface of the base substrate exposed between the guide layer patterns, forming hydrophobic layer patterns which extend from top surfaces of the guide layer patterns to side surfaces of the guide layer patterns and are separated from each other, coating a block copolymer, which comprises the first blocks and the second blocks, on a top surface of the neutral layer exposed between the hydrophobic layer patterns, alternately arranging the first blocks and the second blocks by heat-treating or solvent-annealing the block copolymer, and forming block copolymer patterns by removing the first blocks or the second blocks.

10 Claims, 33 Drawing Sheets

PATTERNING METHOD AND METHOD OF MANUFACTURING WIRE GRID POLARIZER USING THE SAME

This application claims priority to Korean Patent Application No. 10-2014-0122863, filed on Sep. 16, 2014, and all the benefits accruing therefrom under 35 U.S.C. § 119, the disclosure of which is incorporated herein by reference in its entirety.

BACKGROUND

1. Field

The invention relates to a patterning method and a method of manufacturing a wire grid polarizer using the same.

2. Description of the Related Art

Continued demands for miniaturization and high density of high-performance devices have led to a need for an establishment of a fine pattern process. In particular, manufacturing high-density nano-patterns in a large area using a low-cost process is important in developing various next-generation nano-devices.

Until now, an optical lithography technology such as I-line or argon fluoride (ArF) lithography technology has mostly been used.

SUMMARY

Exemplary embodiments of the invention provide a patterning method which may minimize a non-pattern area by reducing critical dimensions ("CD") of linear structures that form a guide pattern, improve vertical alignment of a block copolymer, and prevent the overflow of the block copolymer by reducing wettability of side surfaces of the guide pattern and a method of manufacturing a wire grid polarizer using the patterning method.

However, exemplary embodiments of the invention are not restricted to the one set forth herein. The above and other exemplary embodiments of the invention will become more apparent to one of ordinary skill in the art to which the invention pertains by referencing the detailed description of the invention given below.

According to an exemplary embodiment of the invention, a patterning method includes forming guide layer patterns, which are separated from each other, on a top surface of a base substrate, forming a neutral layer, which includes a random copolymer including first blocks or second blocks, on the entire top surface of the base substrate exposed between the guide layer patterns, forming hydrophobic layer patterns which extend from top surfaces of the guide layer patterns to side surfaces of the guide layer patterns and are separated from each other, coating a block copolymer, which includes the first blocks and the second blocks, on a top surface of the neutral layer exposed between the hydrophobic layer patterns, alternately arranging the first blocks and the second blocks by heat-treating or solvent-annealing the block copolymer, and forming block copolymer patterns by removing the first blocks or the second blocks.

In an exemplary embodiment, the forming the guide layer patterns may include forming a stacked structure including a base substrate, a guide layer, a metal layer, and a sacrificial layer stacked sequentially. In an exemplary embodiment, the forming the guide layer patterns may include further forming a photoresist layer by coating photoresist on the sacrificial layer and forming photoresist patterns which are separated from each other by exposing and developing the photoresist layer. In an exemplary embodiment, the forming the guide layer patterns may further include exposing the metal layer and forming sacrificial layer patterns which are separated from each other by partially removing the sacrificial layer using the photoresist patterns as a mask. In an exemplary embodiment, the forming the guide layer patterns may further include forming a unitary auxiliary guide layer on top and side surfaces of the sacrificial layer patterns and a top surface of the metal layer after removing the photoresist patterns. In an exemplary embodiment, the forming the guide layer patterns may further include forming auxiliary guide patterns which are separated from each other by removing the auxiliary guide layer from the top surfaces of the sacrificial layer patterns and the top surface of the metal layer and then removing the sacrificial layer patterns. In an exemplary embodiment, the forming the guide layer patterns may further include exposing the base substrate and forming guide layer patterns which are separated from each other by sequentially removing the metal layer and the guide layer using the auxiliary guide layer patterns as a mask.

In an exemplary embodiment, the forming the neutral layer may include overcoating the random copolymer on the top surface of the base substrate. In an exemplary embodiment, the forming the neutral layer may further include baking the overcoated random copolymer. In an exemplary embodiment, the forming the neutral layer may further include partially removing the overcoated random polymer and entirely exposing the top surfaces of the guide layer patterns and partially exposing the side surfaces of the guide layer patterns by performing an oxygen ($O_2$) plasma ashing process and then a wash-out process.

In an exemplary embodiment, the forming the hydrophobic layer patterns may include forming a hydrophobic layer by coating a fluorine-based hydrophobic material on the top and side surfaces of the guide layer patterns and the top surface of the neutral layer. In an exemplary embodiment, the forming the hydrophobic layer patterns may further include baking the hydrophobic layer. In an exemplary embodiment, the forming the hydrophobic layer patterns may include exposing the top surface of the neutral layer by removing the hydrophobic layer using a wash-out process.

In an exemplary embodiment, the random copolymer may include at least one of poly(styrene-r-methylmethacrylate) (PS-r-PMMA), poly(styrene-r-butadiene) (PS-r-PB), poly(styrene-r-isoprene) (P S-r-PI), poly(styrene-r-ethylene) (PS-r-PE), poly(styrene-r-ethyleneoxide) (PS-r-PEO), poly(styrene-r-ferrocenyldimethylsilane) (PS-r-PFS), poly(styrene-r-(2-vinylpyridine)) (PS-r-P2VP), and poly(styrene-r-dimethylsiloxane) (PS-r-PDMS). In an exemplary embodiment, an end of the random copolymer may be protected by one reaction group including at least one of a hydroxyl group, an alkoxy group, and a chlorine group.

In an exemplary embodiment, the hydrophobic layer patterns may include a fluorine-based hydrophobic material. In an exemplary embodiment, the fluorine-based hydrophobic material may include one or more of a fluorine-based polymer and a fluorine-based monomer and polydimethylsiloxane. In an exemplary embodiment, an end of the fluorine-based hydrophobic material may be protected by one reaction group including at least one of consisting of a hydroxyl group, an alkoxy group, and a chlorine group.

In an exemplary embodiment, the block copolymer may include at least one of poly(styrene-b-methylmethacrylate) (PS-b-PMMA), poly(styrene-b-butadiene) (PS-b-PB), poly(styrene-b-isoprene) (PS-b-PI), poly(styrene-b-ethylene) (PS-b-PE), poly(styrene-b-ethyleneoxide) (PS-b-PEO), poly(styrene-b-ferrocenyldimethylsilane) (PS-b-PFS), poly(styrene-b-(2-vinylpyridine)) (PS-b-P2VP), and poly(styrene-b-dimethylsiloxane) (PS-b-PDMS).

In an exemplary embodiment, the base substrate may include at least one of silicon oxide ($SiO_2$), silicon nitride (SiNx), and metal.

According to another exemplary embodiment of the invention, a method of manufacturing a wire grid polarizer includes forming a stacked structure including a light-transmitting substrate, a first metal layer, a guide layer, a second metal layer, and a sacrificial layer stacked sequentially, forming guide layer patterns, which are separated from each other, on a top surface of the first metal layer, forming a neutral layer, which includes a random copolymer including first blocks or second blocks, on the entire top surface of the first metal layer exposed between the guide layer patterns, forming hydrophobic layer patterns which extend from top surfaces of the guide layer patterns to side surfaces of the guide layer patterns and are separated from each other, coating a block copolymer, which includes the first blocks and the second blocks, on a top surface of the neutral layer exposed between the hydrophobic layer patterns, alternately arranging the first blocks and the second blocks by heat-treating or solvent-annealing the block copolymer, forming block copolymer patterns by removing the first blocks or the second blocks, and exposing the light-transmitting substrate and forming first metal layer patterns which are separated from each other by sequentially removing the neutral layer and the first metal layer using the block copolymer patterns as a mask.

In an exemplary embodiment, the forming the guide layer patterns may include forming a photoresist layer by coating photoresist on the sacrificial layer and forming photoresist patterns which are separated from each other by exposing and developing the photoresist layer. In an exemplary embodiment, the forming the guide layer patterns may further include exposing the second metal layer and forming sacrificial layer patterns which are separated from each other by partially removing the sacrificial layer using the photoresist patterns as a mask. In an exemplary embodiment, the forming the guide layer patterns may further include forming a unitary auxiliary guide layer on top and side surfaces of the sacrificial layer patterns and a top surface of the second metal layer after removing the photoresist patterns. In an exemplary embodiment, the forming the guide layer patterns may further include forming auxiliary guide patterns which are separated from each other by removing the auxiliary guide layer from the top surfaces of the sacrificial layer patterns and the top surface of the second metal layer and then removing the sacrificial layer patterns. In an exemplary embodiment, the forming the guide layer patterns may further include exposing the first metal layer and forming guide layer patterns which are separated from each other by sequentially removing the second metal layer and the guide layer using the auxiliary guide layer patterns as a mask.

In an exemplary embodiment, the forming the neutral layer may include overcoating the random copolymer on the top surface of the first metal layer. In an exemplary embodiment, the forming the neutral layer may further include baking the overcoated random copolymer. In an exemplary embodiment, the forming the neutral layer may further include partially removing the overcoated random polymer and entirely exposing the top surfaces of the guide layer patterns and partially exposing the side surfaces of the guide layer patterns by performing an $O_2$ plasma ashing process and then a wash-out process.

According to another exemplary embodiment of the invention, a method of manufacturing a wire grid polarizer includes forming a stacked structure including a light-transmitting substrate, a first metal layer, a first capping layer, a guide layer, a second metal layer, a second capping layer, and a sacrificial layer stacked sequentially, forming guide layer patterns, which are separated from each other, on a top surface of the first capping layer, forming a neutral layer, which includes a random copolymer including first blocks or second blocks, on the entire top surface of the first capping layer exposed between the guide layer patterns, forming hydrophobic layer patterns which extend from top surfaces of the guide layer patterns to side surfaces of the guide layer patterns and are separated from each other, coating a block copolymer, which includes the first blocks and the second blocks, on a top surface of the neutral layer exposed between the hydrophobic layer patterns, alternately arranging the first blocks and the second blocks by heat-treating or solvent-annealing the block copolymer, forming block copolymer patterns by removing the first blocks or the second blocks, and exposing the light-transmitting substrate and forming first metal layer patterns which are separated from each other by sequentially removing the neutral layer, the first capping layer and the first metal layer using the block copolymer patterns as a mask.

In an exemplary embodiment, the forming the guide layer patterns may include forming a photoresist layer by coating photoresist on the sacrificial layer and forming photoresist patterns which are separated from each other by exposing and developing the photoresist layer. The forming the guide layer patterns may further include exposing the second capping layer and forming sacrificial layer patterns which are separated from each other by partially removing the sacrificial layer using the photoresist patterns as a mask. The forming the guide layer patterns may further include forming a unitary auxiliary guide layer on top and side surfaces of the sacrificial layer patterns and a top surface of the second capping layer after removing the photoresist patterns. The forming the guide layer patterns may further include forming auxiliary guide patterns which are separated from each other by removing the auxiliary guide layer from the top surfaces of the sacrificial layer patterns and the top surface of the second capping layer and then removing the sacrificial layer patterns. The forming the guide layer patterns may further include exposing the first metal layer and forming guide layer patterns which are separated from each other by sequentially removing the second capping layer, the second metal layer and the guide layer using the auxiliary guide layer patterns as a mask.

In an exemplary embodiment, the forming the neutral layer may include overcoating the random copolymer on the top surface of the first capping layer. In an exemplary embodiment, the forming the neutral layer may further include baking the overcoated random copolymer. In an exemplary embodiment, the forming the neutral layer may further include partially removing the overcoated random polymer and entirely exposing the top surfaces of the guide layer patterns and partially exposing the side surfaces of the guide layer patterns by performing an $O_2$ plasma ashing process and then a wash-out process.

In an exemplary embodiment, the first capping layer may include titanium (Ti) having a lower etch rate than that of the first metal layer.

In an exemplary embodiment, the second capping layer may include Ti having a lower etch rate than that of the second metal layer.

Exemplary embodiments of the invention provide at least one of the following advantages.

The CD of linear structures that form a guide pattern are reduced using double patterning technology, thereby minimizing a non-pattern area.

In addition, a neutral layer having similar preferences for first and second blocks of a block copolymer is disposed on a bottom plate exposed between guide layer patterns. The neutral layer may improve vertical alignment of the first and second blocks.

Further, a hydrophobic layer is disposed on top and side surfaces of the guide layer patterns to reduce wettability. The reduced wettability may improve the overflow of the block copolymer.

However, the effects of the invention are not restricted to the one set forth herein. The above and other effects of the invention will become more apparent to one of daily skill in the art to which the invention pertains by referencing the claims.

BRIEF DESCRIPTION OF THE DRAWINGS

The above and other exemplary embodiments and features of the invention will become more apparent by describing in detail exemplary embodiments thereof with reference to the attached drawings, in which.

DETAILED DESCRIPTION

Figure 1:
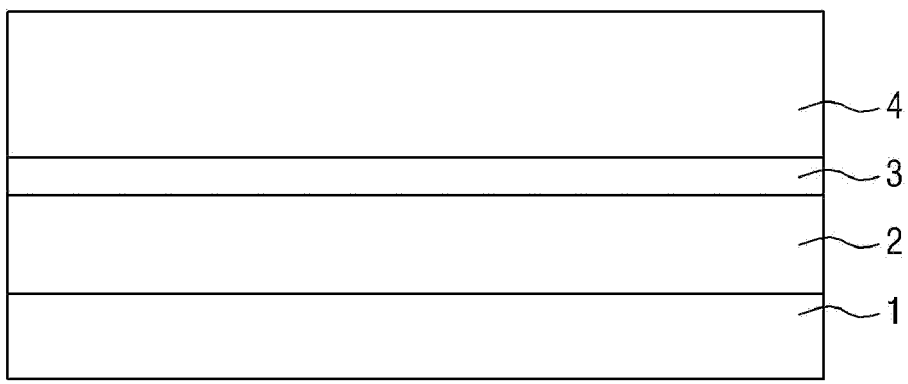
FIG. 1 illustrates an operation of forming a stacked structure composed of a base substrate, a guide layer, a metal layer, and a sacrificial layer stacked sequentially.

Features of the invention and methods of accomplishing the same may be understood more readily by reference to the following detailed description of preferred embodiments and the accompanying drawings. The invention may, however, be embodied in many different forms and should not be construed as being limited to the embodiments set forth herein. Rather, these embodiments are provided so that this invention will be thorough and complete and will fully convey the concept of the invention to those skilled in the art, and the invention will only be defined by the appended claims.

In the drawings, the thickness of layers and regions are exaggerated for clarity. It will be understood that when an element or layer is referred to as being "on," "connected to" or "coupled to" another element or layer, the element or layer can be directly on, connected or coupled to another element or layer or intervening elements or layers. In contrast, when an element is referred to as being "directly on," "directly connected to" or "directly coupled to" another element or layer, there are no intervening elements or layers present. As used herein, connected may refer to elements being physically, electrically and/or fluidly connected to each other.

Like numbers refer to like elements throughout. It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

It will be further understood that the terms "comprises," "comprising," "includes" and/or "including," when used in this specification, specify the presence of stated features, integers, operations, elements, and/or components, but do not preclude the presence or addition of one or more other features, integers, steps, operations, elements, components, and/or groups thereof.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example In an exemplary embodiment, when the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Exemplary embodiments of the invention will hereinafter be described with reference to the attached drawings.

FIGS. 1 through 10 illustrate a process of forming guide layer patterns using a patterning method according to an exemplary embodiment of the invention.

FIG. 1 illustrates an operation of forming a stacked structure composed of a base substrate 1, a guide layer 2, a metal layer 3, and a sacrificial layer 4 stacked sequentially.

In an exemplary embodiment, the base substrate 1 may include silicon oxide ($SiO_2$), silicon nitride (SiNx), or metal, for example. The guide layer 2 is a mother layer for forming guide layer patterns. In an exemplary embodiment, the guide layer 2 may include SiNx, for example. The metal layer 3 may serve as a hard mask and may include a material having a lower etch rate than that of the guide layer 2. In an exemplary embodiment, the metal layer 3 may include aluminum (Al), for example. The sacrificial layer 4 may be used to form auxiliary guide layer patterns and may include a material having a higher etch rate than that of the metal layer 3. In an exemplary embodiment, the sacrificial layer 4 may include SiNx, for example.

Referring to FIG. 1, the guide layer 2 covers the entire top surface of the base substrate 1, the metal layer 3 covers the entire top surface of the guide layer 2, and the sacrificial layer 4 covers the entire top surface of the metal layer 3.

Figure 2:
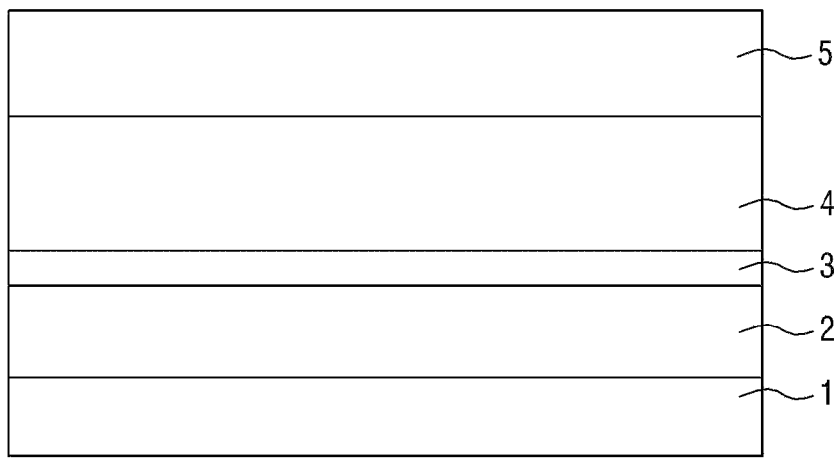
FIG. 2 illustrates an operation of forming a photoresist layer on the entire top surface of the sacrificial layer.
Figure 3:
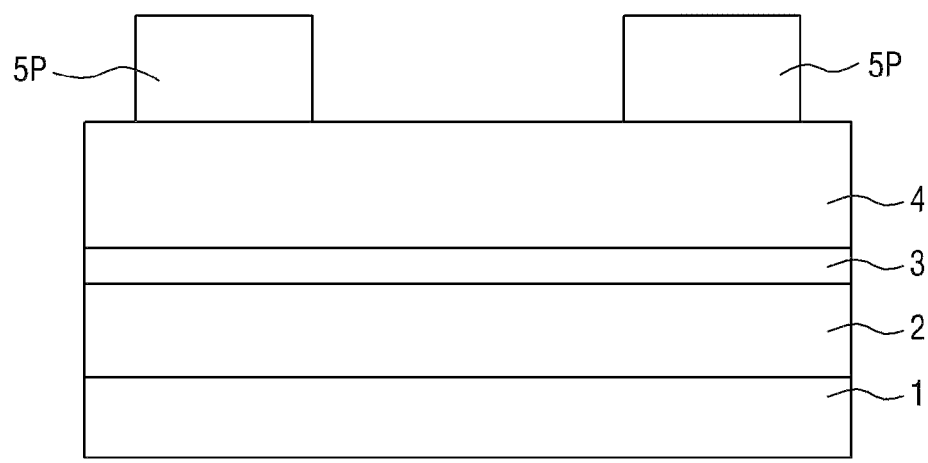
FIG. 3 illustrates an operation of forming photoresist layer patterns using photolithography.

FIG. 2 illustrates an operation of forming a photoresist layer 5 on the entire top surface of the sacrificial layer 4. FIG. 3 illustrates an operation of forming photoresist layer patterns 5P using photolithography.

The photoresist layer 5 may be provided by coating photoresist on the entire top surface of the sacrificial layer 4, and the photoresist layer patterns 5P may be provided by exposing, developing and baking the photoresist layer 5 using photolithography. The photoresist layer patterns 5P may be separated from each other on the top surface of the sacrificial layer 4, and the sacrificial layer 4 may be exposed between the photoresist layer patterns 5P.

Figure 4:
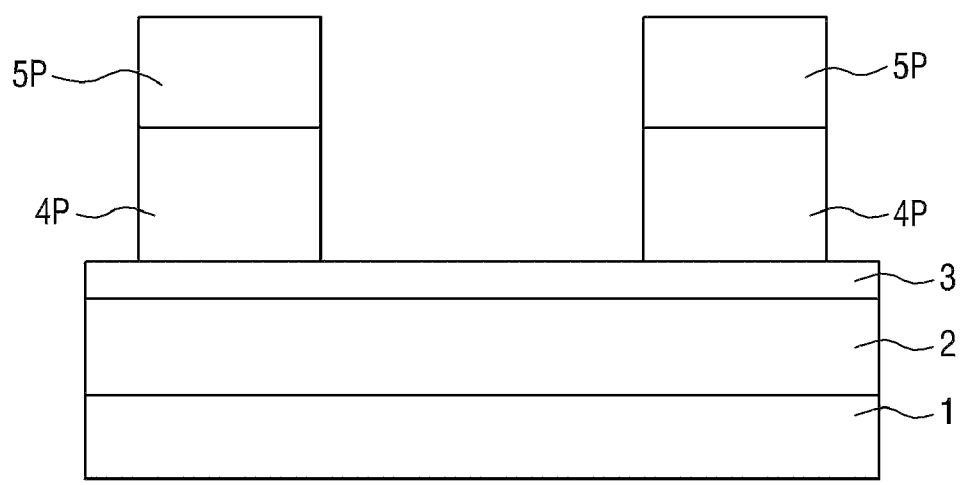
FIGS. 4 and 5 illustrate an operation of forming sacrificial layer patterns using the photoresist layer patterns as a mask.
Figure 5:
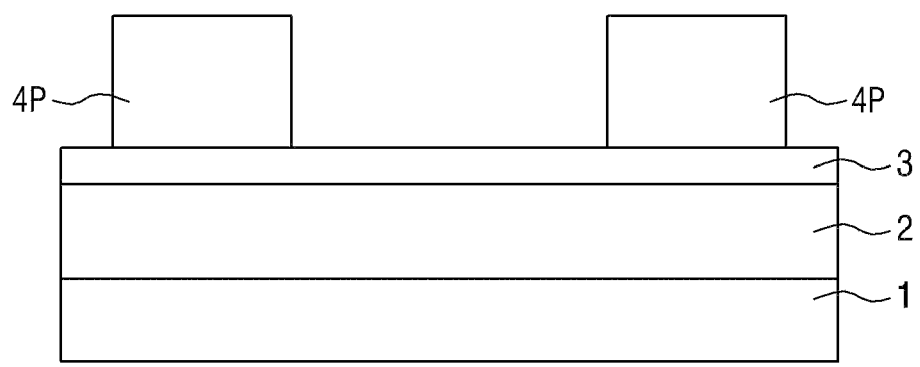

FIGS. 4 and 5 illustrate an operation of forming sacrificial layer patterns 4P using the photoresist layer patterns 5P as a mask.

Referring to FIGS. 4 and 5, a portion of the sacrificial layer 4 which is not protected by the photoresist layer patterns 5P may be removed. The sacrificial layer patterns 4P may be provided in areas protected by the photoresist layer patterns 5P. The sacrificial layer patterns 4P may be arranged on the top surface of the metal layer 3 to be separated from each other, and the metal layer 3 may be exposed between the sacrificial layer patterns 4P. FIG. 5 illustrates an operation of removing the photoresist layer patterns 5P.

Figure 6:
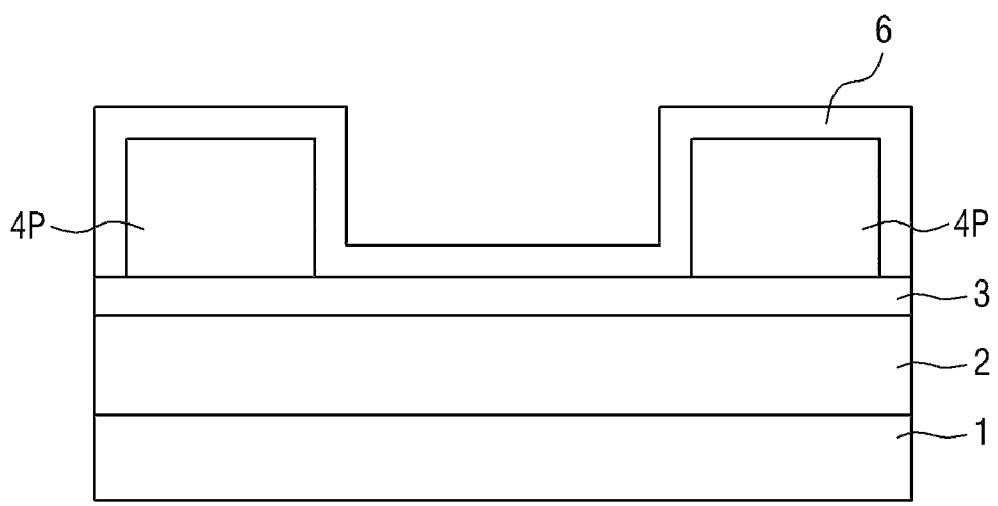
FIG. 6 illustrates an operation of forming an auxiliary guide layer on the sacrificial layer patterns and the metal layer exposed between the sacrificial layer patterns.

FIG. 6 illustrates an operation of forming an auxiliary guide layer 6 on the sacrificial layer patterns 4P and the metal layer 3 exposed between the sacrificial layer patterns 4P.

The auxiliary guide layer 6 may include a material having a lower etch rate than that of the sacrificial layer 4. In an exemplary embodiment, the auxiliary guide layer 6 may include $SiO_2$, for example.

The auxiliary guide layer 6 covers the entire top and side surfaces of the sacrificial layer patterns 4 and the whole of the metal layer 3.

Figure 7:
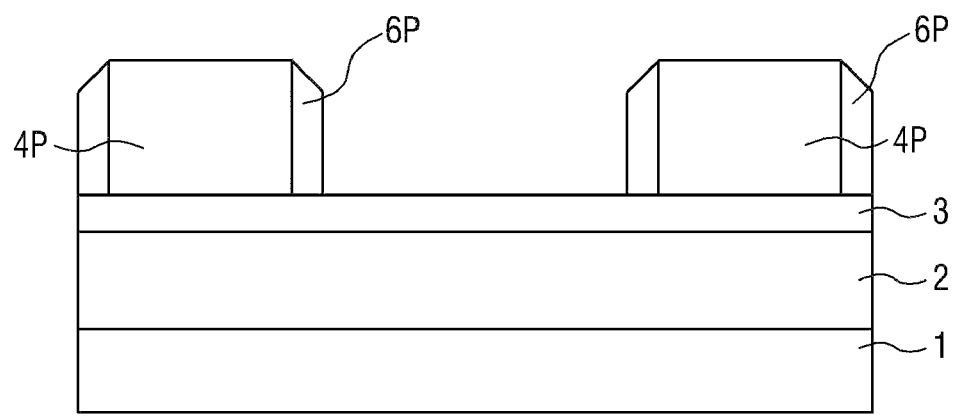
FIG. 7 illustrates an operation of forming auxiliary guide layer patterns.
Figure 8:
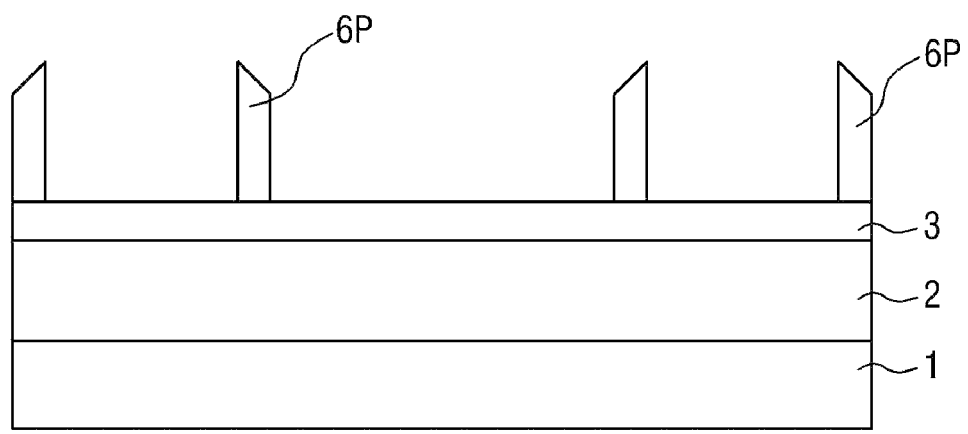
FIG. 8 illustrates an operation of removing the sacrificial layer patterns between the auxiliary guide layer patterns.

FIG. 7 illustrates an operation of forming auxiliary guide layer patterns 6P. FIG. 8 illustrates an operation of removing the sacrificial layer patterns 4P between the auxiliary guide layer patterns 6P.

Referring to FIG. 7, the auxiliary guide layer 6 may be removed from top surfaces of the sacrificial layer patterns 4P and the top surface of the metal layer 3. Referring to FIG. 8, the sacrificial layer patterns 4P between the auxiliary guide layer patterns 6P may be removed. The auxiliary guide layer patterns 6P may be provided on the top surface of the metal layer 3 to be separated from each other, and the metal layer 3 may be partially exposed between the auxiliary guide layer patterns 6P.

Figure 9:
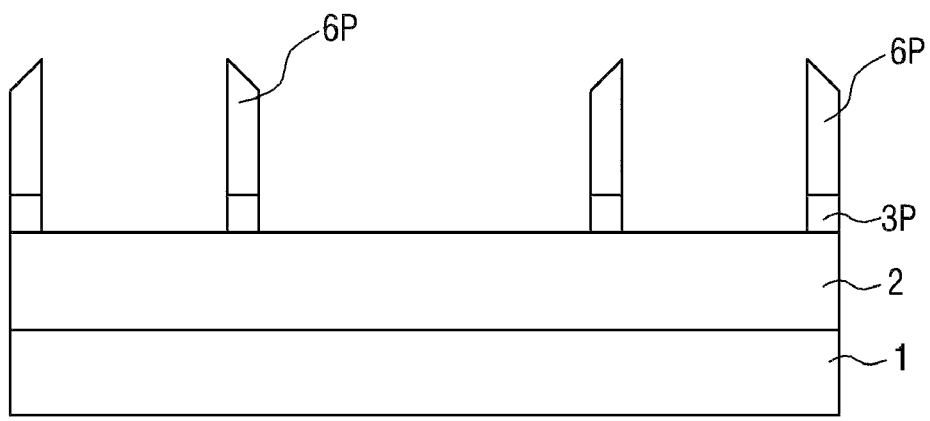
FIG. 9 illustrates an operation of forming metal layer patterns by partially removing the metal layer using the auxiliary guide layer patterns as a mask.

FIG. 9 illustrates an operation of forming metal layer patterns 3P by partially removing the metal layer 3 using the auxiliary guide layer patterns 6P as a mask.

Referring to FIG. 9, portions of the metal layer 3 which are not protected by the auxiliary guide layer patterns 6P may be removed to form the metal layer patterns 3P, which are separated from each other, on the top surface of the guide layer 2. The guide layer 2 may be exposed between the metal layer patterns 3P.

Figure 10:
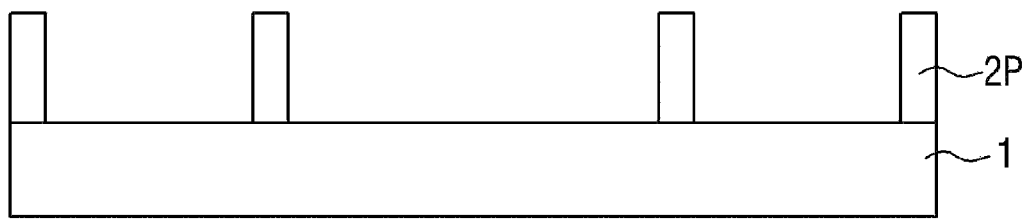
FIG. 10 illustrates an operation of partially removing the guide layer and forming guide layer patterns on a top surface of the base substrate using the auxiliary guide layer patterns and the metal layer patterns as a mask and then removing layers disposed on the guide layer patterns.

FIG. 10 illustrates an operation of partially removing the guide layer 2 and forming guide layer patterns 2P on the top surface of the base substrate 1 using the auxiliary guide layer patterns 6P and the metal layer patterns 3P as a mask and then removing the layer patterns 6P and 3P disposed on the guide layer patterns 2P.

Referring to FIG. 10, the guide layer patterns 2P may be provided on the top surface of the base substrate 1 to be separated from each other. In an exemplary embodiment, a part of the metal layer patterns 3 may remain on top surfaces of the guide layer patterns 2P.

Figure 11:
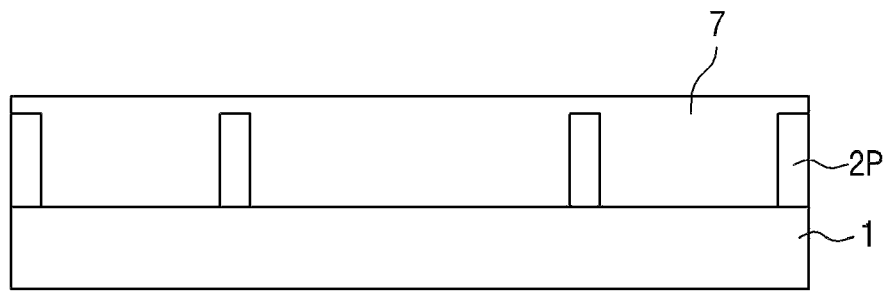
FIG. 11 illustrates an operation of overcoating a neutral layer.

FIG. 11 illustrates an operation of overcoating a neutral layer 7. Referring to FIG. 11, the neutral layer 7 may be overcoated onto the guide layer patterns 2P. The overcoated neutral layer 7 may fill each space between the guide patterns 2P to cover the top surfaces of the guide patterns 2P and the top surface of the base substrate 1.

In an exemplary embodiment, the neutral layer 7 may be a random copolymer including first blocks and second blocks which have similar preferences for first blocks and second blocks of a block copolymer 9 (see FIG. 15) that is to be coated in a subsequent process. Here, the random copolymer including the first blocks and the second blocks is not restricted by diblock copolymer.

In an exemplary embodiment, the neutral layer 7 may include at least one of poly(styrene-r-methylmethacrylate) (PS-r-PMMA), poly(styrene-r-butadiene) (PS-r-PB), poly(styrene-r-isoprene) (P S-r-PI), poly(styrene-r-ethylene) (PS-r-PE), poly(styrene-r-ethyleneoxide) (PS-r-PEO), poly(styrene-r-ferrocenyldimethylsilane) (PS-r-PFS), poly(styrene-r-(2-vinylpyridine)) (PS-r-P2VP), poly(styrene-r-dimethylsiloxane) (PS-r-PDMS), etc.

An end of the random copolymer of the neutral layer 7 may be protected by one reaction group including at least one of a hydroxyl group, an alkoxy group and a chlorine group (Cl—), for example, and may be bonded with the base substrate 1 by the reaction group.

Figure 12:
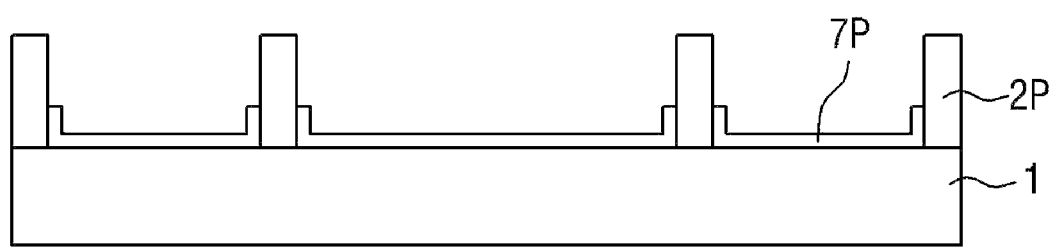
FIG. 12 illustrates an operation of forming neutral layer patterns only on the entire top surface of the base substrate by partially removing the overcoated neutral layer.

FIG. 12 illustrates an operation of forming neutral layer patterns 7P on the exposed top surface of the base substrate 1 between guide layer patterns 2P by partially removing the overcoated neutral layer 7.

The neutral layer patterns 7P may be provided by baking the overcoated neutral layer 7 and then partially removing the overcoated neutral layer 7 using an oxygen ($O_2$) plasma ashing process and a wash-out process to entirely expose the top surfaces of the guide layer patterns 2P and partially expose side surfaces of the guide layer patterns 2P.

Both ends of each neutral layer pattern 7P may extend toward the side surfaces of the guide layer patterns 2P. In an exemplary embodiment, both ends of each neutral layer pattern 7P may be thicker than a central portion thereof. That is, a trench may be defined in a surface of each neutral layer pattern 7P.

Figure 13:
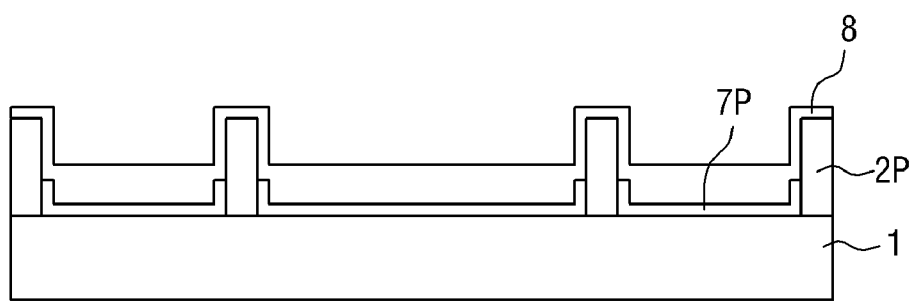
FIG. 13 illustrates an operation of overcoating a hydrophobic layer.

FIG. 13 illustrates an operation of overcoating a hydrophobic layer 8.

The hydrophobic layer 8 may reduce the overflow of the block copolymer 9 (see FIG. 15) when the block copolymer 9 (see FIG. 15) is coated in a subsequent process due to an increase in wettability of the surfaces of the guide layer patterns 2P after the $O_2$ plasma ashing process.

The hydrophobic layer 8 may include a fluorine-based hydrophobic material. In an exemplary embodiment, the fluorine-based hydrophobic material may include one or more of a fluorine-based polymer and a fluorine-based monomer and an adhesive component such as polydimethylsiloxane which is a silicon-based adhesive.

The overcoated hydrophobic layer 8 may extend from the top surfaces of the guide layer patterns 2P to top surfaces of the neutral layer patterns 7P via the side surfaces of the guide layer patterns 2P. The overcoated hydrophobic layer 8 may cover the top and side surfaces of the guide layer patterns 2P and the entire top surfaces of the neutral layer patterns 7P.

Figure 14:
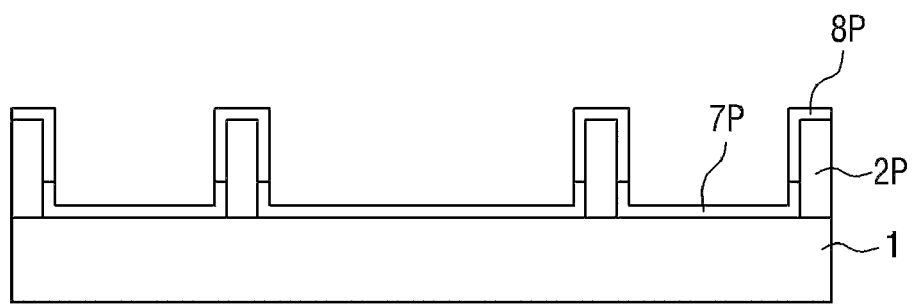
FIG. 14 illustrates an operation of forming hydrophobic layer patterns only on top and side surfaces of the guide layer patterns by partially removing the overcoated hydrophobic layer.

FIG. 14 illustrates an operation of forming hydrophobic layer patterns 8P only on the top and side surfaces of the guide layer patterns 2P by partially removing the overcoated hydrophobic layer 8.

Referring to FIG. 14, the hydrophobic layer patterns 8P may respectively extend from the top surfaces of the guide layer patterns 2P to the side surfaces of the guide layer patterns 2P and may be separated from each other. A top surface of the trench of each neutral layer pattern 7P may be exposed between the hydrophobic layer patterns 8P. An end of each hydrophobic layer pattern 8P may contact an end of a corresponding neutral layer pattern 7P which partially covers a side surface of a corresponding guide layer pattern 2P.

The hydrophobic layer patterns 8P may be provided by baking the overcoated hydrophobic layer 8 and then removing an excess hydrophobic layer 8 by cleaning the hydrophobic layer 8.

Figure 15:
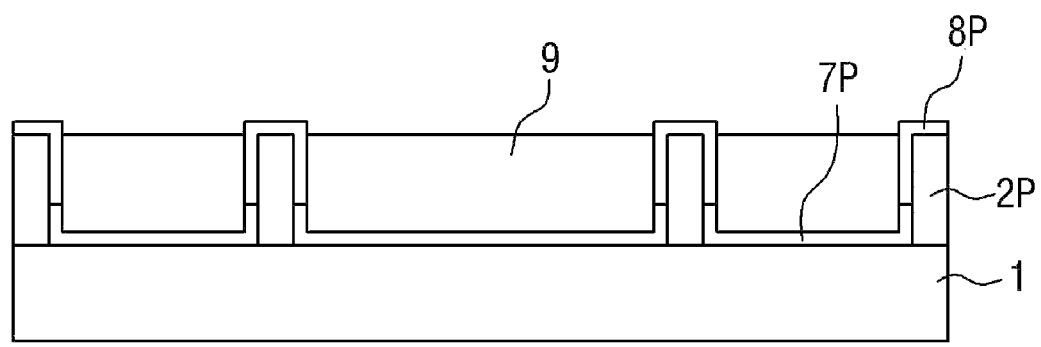
FIG. 15 illustrates an operation of coating a block copolymer.
Figure 16:
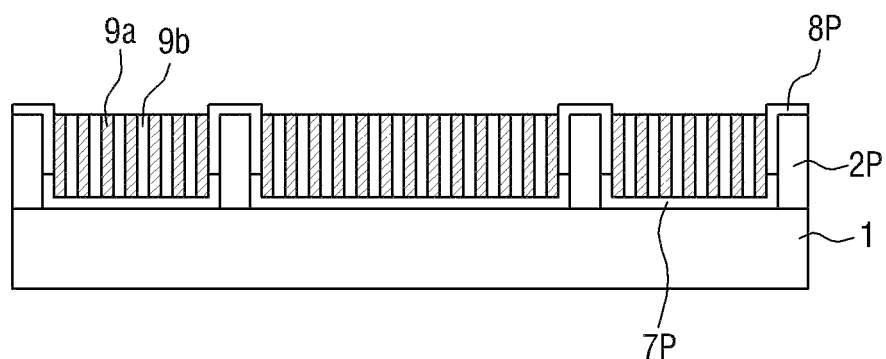
FIG. 16 illustrates an operation of self-aligning first and second blocks by heat-treating or solvent-annealing the block copolymer.

FIG. 15 illustrates an operation of coating the block copolymer 9. FIG. 16 illustrates an operation of self-aligning the first blocks 9a and the second blocks 9b by heat-treating or solvent-annealing the block copolymer 9.

The block copolymer 9 may include first blocks 9a (see FIG. 16) and second blocks 9b (see FIG. 16). In an exemplary embodiment, one of the first and second blocks 9a and 9b may be polar, and the other one may be non-polar.

In an exemplary embodiment, the block copolymer 9 may include at least one of poly(styrene-b-methylmethacrylate) (PS-b-PMMA), poly(styrene-b-butadiene) (PS-b-PB), poly(styrene-b-isoprene) (PS-b-PI), poly(styrene-b-ethylene) (PS-b-PE), poly(styrene-b-ethyleneoxide) (PS-b-PEO), poly(styrene-b-ferrocenyldimethylsilane) (PS-b-PFS), poly(styrene-b-(2-vinylpyridine)) (PS-b-P2VP), poly(styrene-b-dimethylsiloxane) (PS-b-PDMS), etc.

The heat-treatment condition for the self-alignment of the block copolymer 9 is set to a temperature range of a glass transition temperature that causes the block copolymer 9 to have fluidity to a temperature that does not pyrolyze the block copolymer 9.

In an exemplary embodiment, PS-b-PMMA may be self-aligned at a temperature of approximately 100 degrees Celsius (° C.) or above, for example. However, it takes a long time for PS-b-PMMA to be completely self-assembled at low temperatures. Therefore, PS-b-PMMA may be heat-treated at approximately 250° C. in a high-vacuum (oxygen-free) atmosphere. In this case, since the flow of molecules is active, regular self-alignment may be completed within a substantially short time.

In solvent annealing for self-aligning the block copolymer 9, a saturated solvent gas is used to give flexibility and mobility to a polymer chain. Accordingly, a solvent is evaporated from the surface of a thin film, thus causing the thin film to be self-aligned.

Before the self-alignment of the block copolymer 9, the first blocks 9a and the second blocks 9b of the block copolymer 9 are distributed disorderly without forming a particular pattern. However, as the block copolymer 9 is self-aligned, molecules flow to form a particular pattern. The first blocks 9a and the second blocks 9b of the block copolymer 9 may be arranged alternately while being aligned perpendicular to the base substrate 1.

The first blocks 9a or the second blocks 9b may be removed to form block copolymer patterns between the guide layer patterns 2P, and layers disposed under the block copolymer patterns may be patterned using the block copolymer patterns as a mask.

FIGS. 17 through 24 illustrate a process of forming guide layer patterns 2P in a method of manufacturing a wire grid polarizer according to an exemplary embodiment of the invention.

Figure 17:
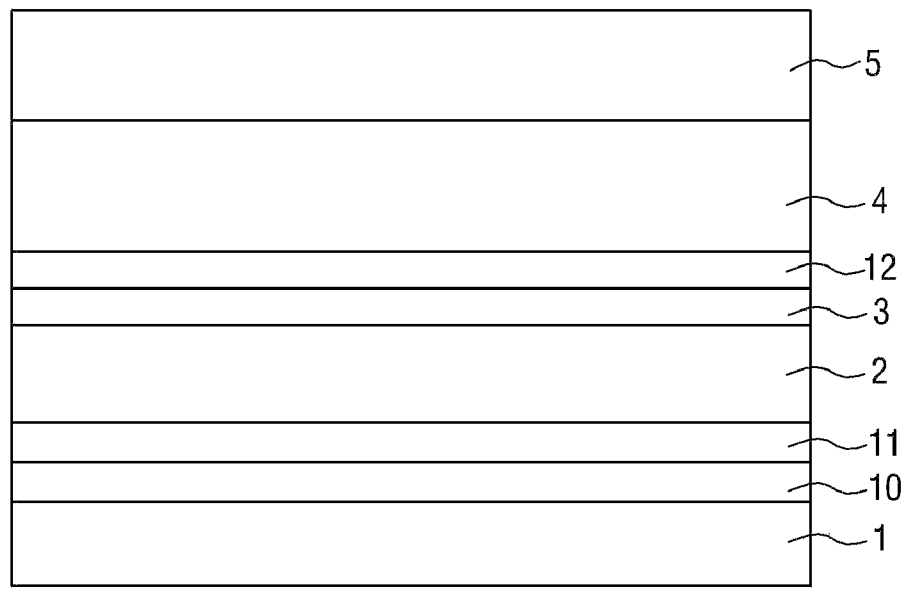
FIGS. 17 through 24 illustrate a process of an exemplary embodiment of forming guide layer patterns in a method of manufacturing a wire grid polarizer according to the invention.

A stacked structure of FIG. 17 is different from the stacked structure of FIG. 2 in that a base substrate 1 is a light-transmitting substrate, that a metal layer 10 and a capping layer 11 are sequentially stacked between the base substrate 1 and a guide layer 2, and that a capping layer 12 is interposed between a metal layer 3 and a sacrificial layer 4.

For ease of the description, the metal layer 10 will be referred to as a first metal layer 10, the metal layer 3 will be referred to as a second metal layer 3, the capping layer 11 will be referred to as a first capping layer 11, and the capping layer 12 will be referred to as a second capping layer 12.

In an exemplary embodiment, the first metal layer 10 may include aluminum (Al), gold (Au), silver (Ag), copper (Cu), etc. In an exemplary embodiment, the first metal layer 10 may include Al having high reflectivity, for example.

The first capping layer 11 may include a material having a lower etch rate than that of the first metal layer 10. In an exemplary embodiment, the first capping layer 11 may include titanium (Ti), for example. In another exemplary embodiment, the first capping layer 11 may be omitted. However, it is desirable to form the first capping layer 11 on the first metal layer 10 in order to prevent a hillock phenomenon of the first metal layer 10.

The second capping layer 12 may include a material having a lower etch rate than that of the second metal layer 3. In an exemplary embodiment, the second capping layer 12 may include Ti, for example. In another exemplary embodiment, the second capping layer 12 may be omitted. However, it is desirable to form the second capping layer 12 on the second metal layer 3 in order to prevent a hillock phenomenon of the second metal layer 3.

Figure 18:
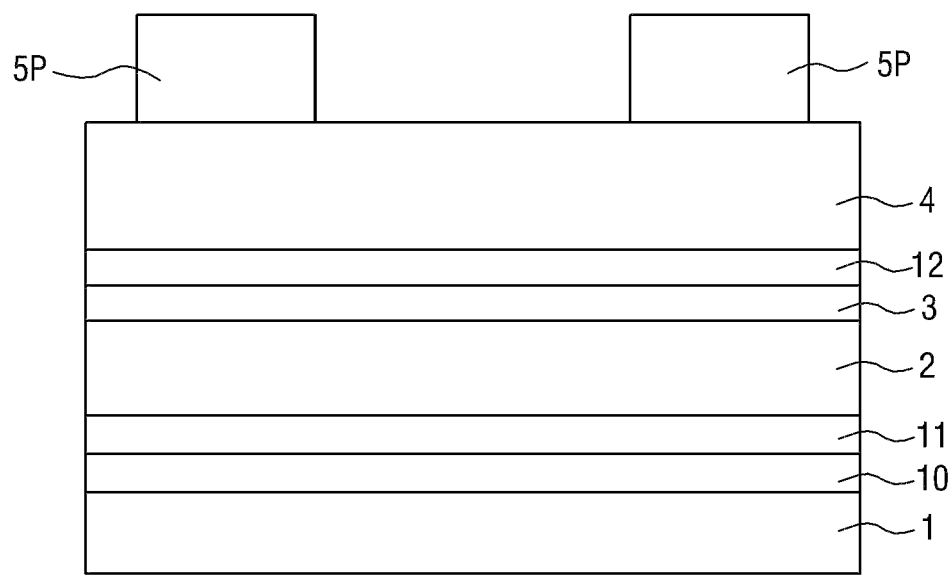

Referring to FIG. 18, the photoresist layer patterns 5P may be provided by exposing, developing and baking the photoresist layer 5 using photolithography. The photoresist layer patterns 5P may be separated from each other on the top surface of the sacrificial layer 4, and the sacrificial layer 4 may be exposed between the photoresist layer patterns 5P.

Figure 19:
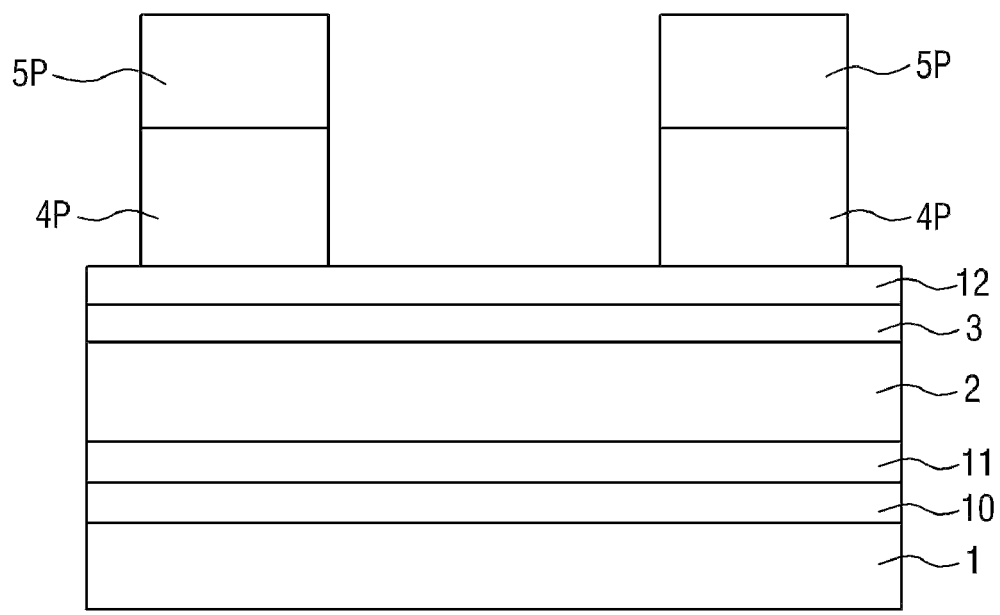

FIG. 19 is different from FIG. 4 in that the second capping layer 12 is exposed between sacrificial layer patterns 4P in FIG. 19, whereas the second metal layer 3 is exposed between the sacrificial layer patterns 4P in FIG. 4.

Figure 20:
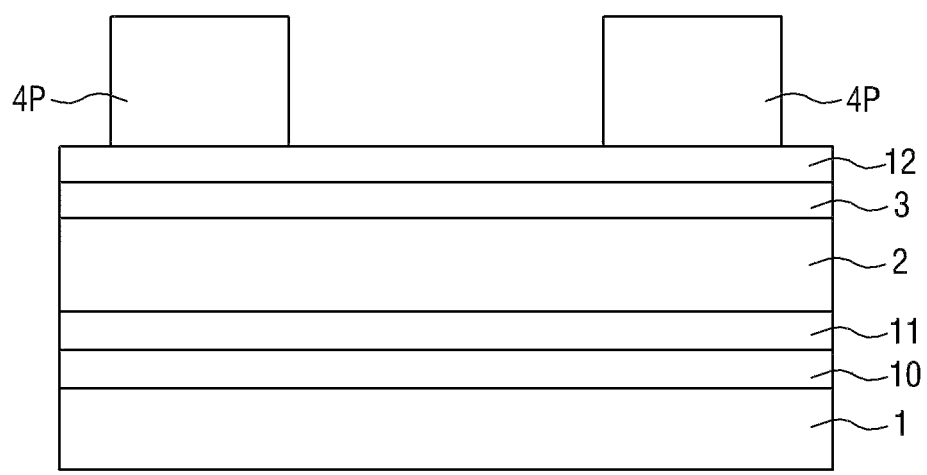

Referring to FIG. 20, the photoresist layer patterns 5P may be removed. The sacrificial layer patterns 4P may be provided in areas protected by the photoresist layer patterns 5P.

Figure 21:
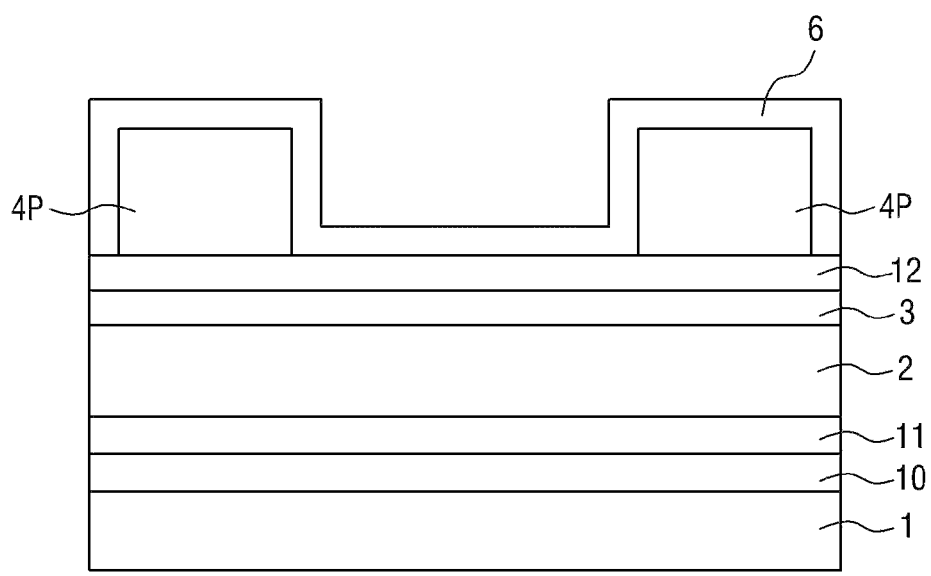

FIG. 21 is different from FIG. 6 in that a unitary auxiliary guide layer 6 is disposed on top and side surfaces of the sacrificial layer patterns 4P and a top surface of the second capping layer 12 in FIG. 21, whereas the auxiliary guide layer 6 is disposed on the top and side surfaces of the sacrificial layer patterns 4P and the top surface of the metal layer 3 in FIG. 6.

Figure 22:
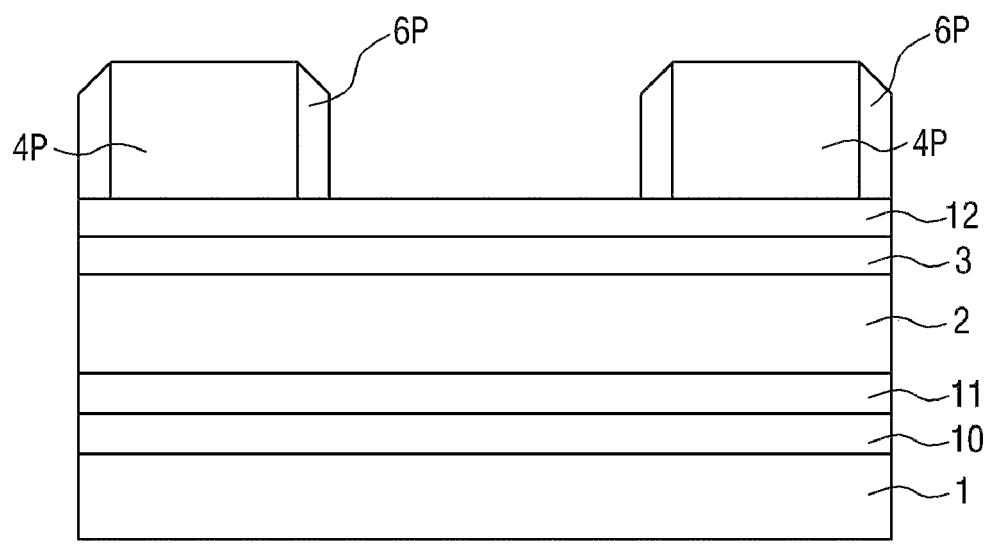
Figure 23:
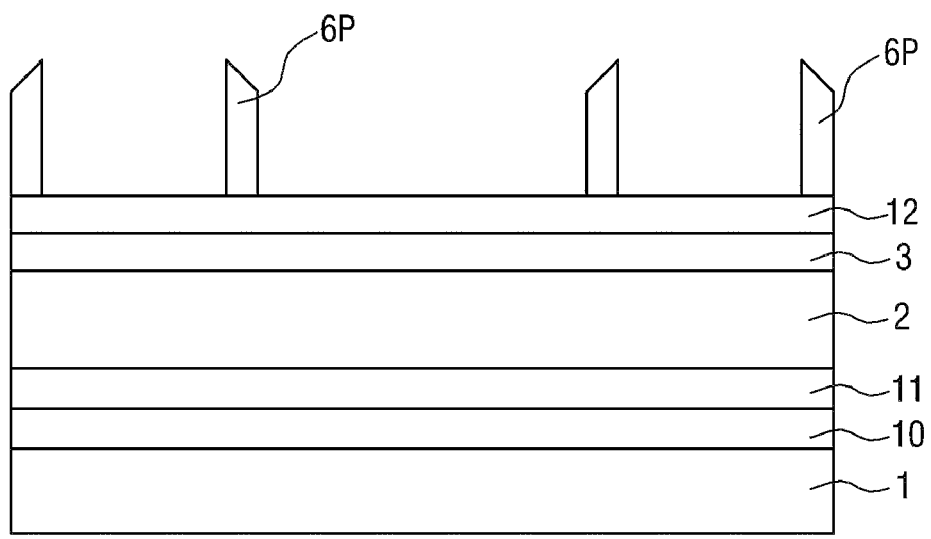

FIGS. 22 and 23 are different from FIGS. 7 and 8 in that the second capping layer 12 is exposed between auxiliary guide layer patterns 6P in FIGS. 22 and 23, whereas the metal layer 3 is exposed between the auxiliary guide layer patterns 6P in FIGS. 7 and 8.

Figure 24:
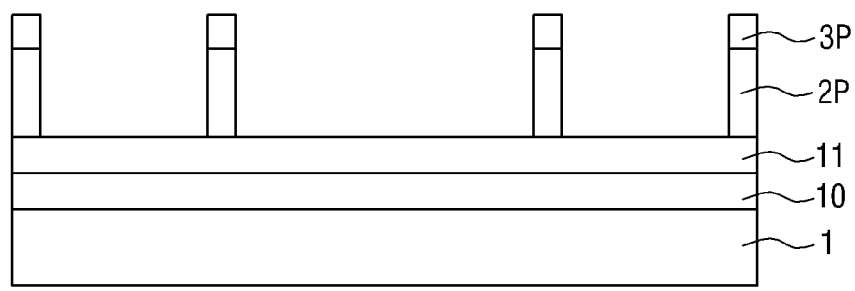

FIG. 24 is different from FIG. 10 in that guide layer patterns 2P are provided on the top surface of the first capping layer 11 in FIG. 24, whereas the guide layer patterns 2P are provided on the top surface of the base substrate 1 in FIG. 10. In addition, FIG. 24 is different from FIG. 10 in that second metal layer patterns 3P remain on top surfaces of the guide layer patterns 2P. However, in another exemplary embodiment, the second metal layer patterns 3P may also be completely removed.

Figure 25:
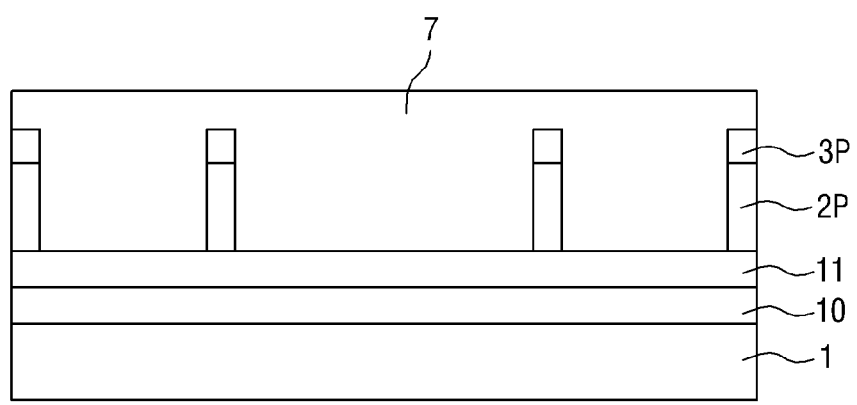
FIG. 25 illustrates an operation of overcoating a neutral layer.

FIG. 25 illustrates an operation of overcoating a neutral layer 7. FIG. 25 is different from FIG. 11 in that the overcoated neutral layer 7 covers a top surface of the first capping layer 11 in FIG. 25, whereas the overcoated neutral layer 7 covers the top surface of the base substrate 1 in FIG. 11.

Figure 26:
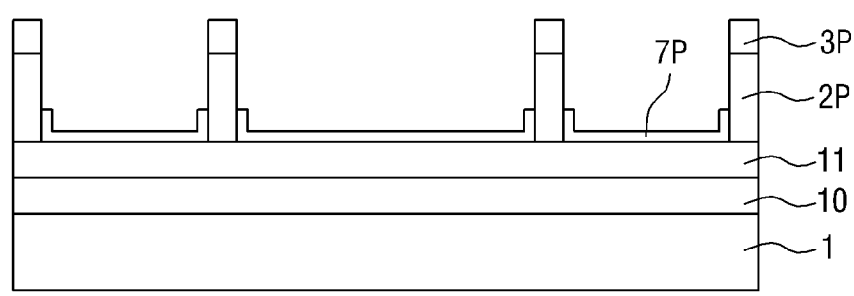
FIG. 26 illustrates an operation of forming neutral layer patterns only on the entire top surface of a first capping layer by partially removing the overcoated neutral layer.

FIG. 26 illustrates an operation of forming neutral layer patterns 7P only on the exposed top surface of the first capping layer 11 between the guide layer patterns 2P by partially removing the overcoated neutral layer 7.

FIG. 26 is different from FIG. 12 in that the neutral layer patterns 7P are provided on the top surface of the first capping layer 11 in FIG. 26, whereas the neutral layer patterns 7P are provided on the top surface of the base substrate 1 in FIG. 12.

Figure 27:
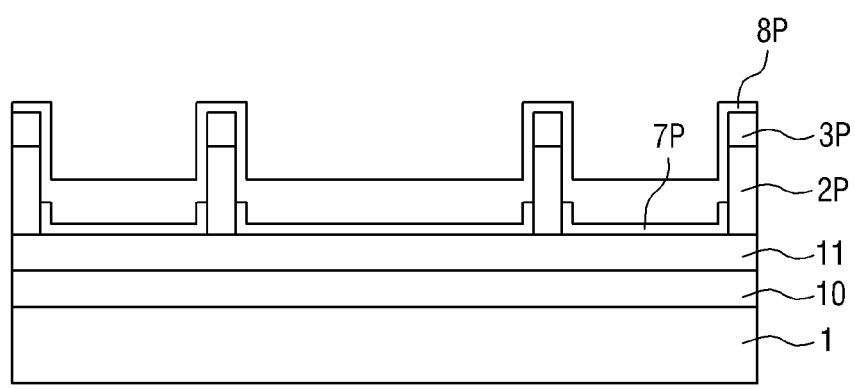
FIG. 27 illustrates an operation of overcoating a hydrophobic layer.
Figure 28:
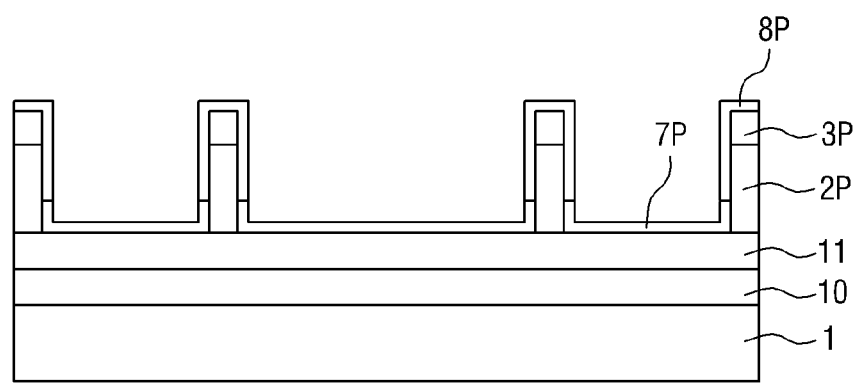
FIG. 28 illustrates an operation of forming hydrophobic layer patterns by partially removing the overcoated hydrophobic layer.

FIG. 27 illustrates an operation of overcoating a hydrophobic layer 8. FIG. 28 illustrates an operation of forming hydrophobic layer patterns 8P by partially removing the overcoated hydrophobic layer 8.

FIG. 27 is different from FIG. 13 in that the overcoated hydrophobic layer 8 covers the top and side surfaces of the second metal layer patterns 3P and side surfaces of the guide layer patterns 2P in FIG. 27, whereas the overcoated hydrophobic layer 8 covers the top and side surfaces of the guide layer patterns 2P in FIG. 13.

Figure 29:
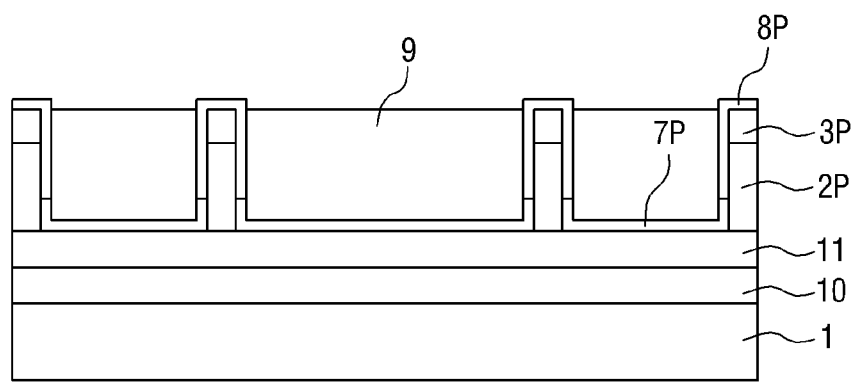
FIG. 29 illustrates an operation of coating a block copolymer.
Figure 30:
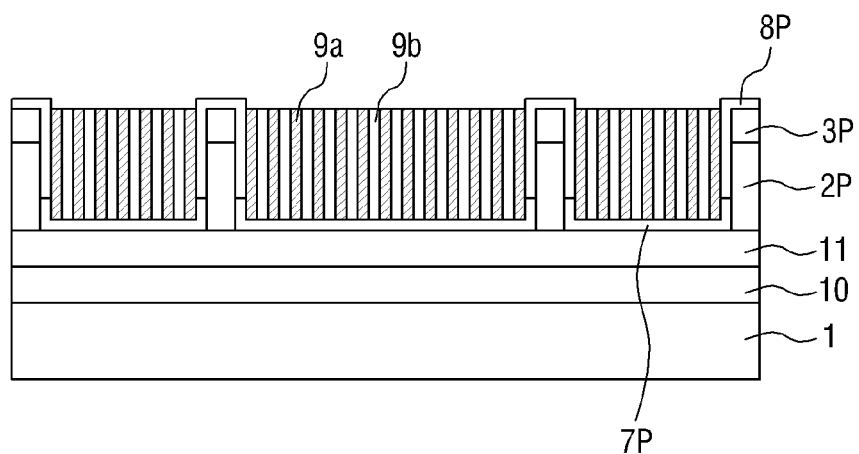
FIG. 30 illustrates an operation of self-aligning first and second blocks by heat-treating or solvent-annealing the block copolymer.
Figure 31:
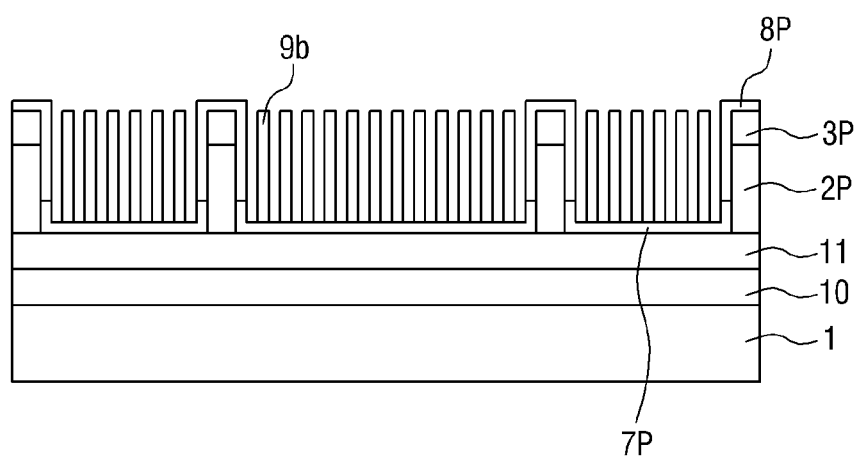
FIG. 31 illustrates an operation of removing the first blocks.

FIG. 29 illustrates an operation of coating a block copolymer 9. FIG. 30 illustrates an operation of self-aligning first blocks 9a and second blocks 9b by heat-treating or solvent-annealing the block copolymer 9. FIG. 31 illustrates an operation of removing the first blocks 9a.

Referring to FIG. 31, the second blocks 9b may be disposed on a top surface of a trench of each neutral layer pattern 7P by removing the first blocks 9a.

Figure 32:
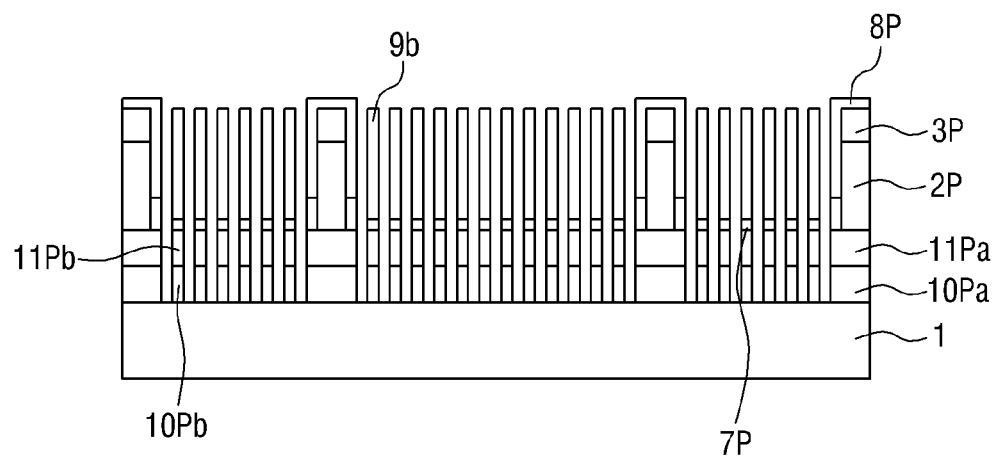
FIG. 32 illustrates an operation of patterning layers disposed under the second blocks using the second blocks as a mask.

FIG. 32 illustrates an operation of patterning layers disposed under the second blocks 9b using the second blocks 9b as a mask.

Referring to FIGS. 31 and 32, the neutral layer patterns 7P, the first capping layer 11, and the first metal layer 10 under the second blocks 9b may be sequentially patterned using the second blocks 9b as a mask. The neutral layer patterns 7P, first capping layer patterns 11Pb, and first metal layer patterns 10Pb may be provided in each area protected by the second blocks 9b and may be separated from each other to expose the light-transmitting substrate. A first capping layer pattern 11Pa and a first metal layer pattern 10Pa may be provided in an area protected by each hydrophobic layer pattern 8P. The first capping layer patterns 11Pb and the first metal layer patterns 10Pb are provided between the first capping layer patterns 11Pa and the first metal layer patterns 10Pa.

Figure 33:
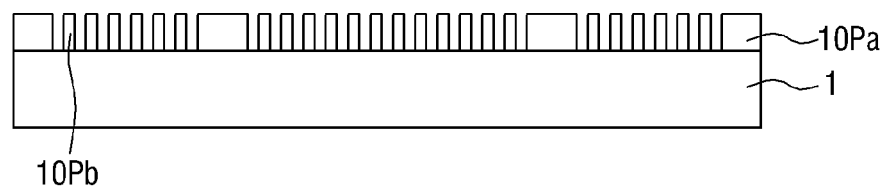
FIG. 33 illustrates an operation of removing layers disposed on a top surface of a light-transmitting substrate, excluding first metal layer patterns.

FIG. 33 illustrates an operation of removing layers (11Pa, 11Pb, 7P, 2P, 3P and 8P) disposed on the top surface of the base substrate 1, excluding the first metal layer patterns 10Pa and 10Pb.

Referring to FIG. 33, an aperture area of a wire grid polarizer manufactured according to an exemplary embodiment of the invention may have a structure in which the first metal layer patterns 10Pa and 10Pb are disposed on the top surface of the light-transmitting base substrate 1. In a non-aperture area of the wire grid polarizer, the light-transmitting base substrate 1 is not exposed between the first metal layer patterns 10Pa and 10Pb.

The wire grid polarizer is a type of optical device that induces unpolarized light into linearly polarized light having a specific oscillation direction. The wire grid polarizer typically has a structure in which a plurality of fine metal lines is arranged parallel to each other on a light-transmitting substrate.

When a pitch of the fine metal lines is sufficiently shorter than a wavelength of incident light, a component (i.e., p-polarized light) of the incident light which has an electric field vector orthogonal to the fine metal lines is transmitted through the wire grid polarizer, whereas a component (i.e., s-polarized light) having an electric field vector parallel to the fine metal lines is reflected. The wire grid polarizer may increase light efficiency by recycling the s-polarized light.

While the invention has been particularly shown and described with reference to exemplary embodiments thereof, it will be understood by those of ordinary skill in the art that various changes in provide and detail may be made therein without departing from the spirit and scope of the invention as defined by the following claims. The exemplary embodiments should be considered in a descriptive sense only and not for purposes of limitation.

What is claimed is:

1. A patterning method comprising:
    forming guide layer patterns, which are separated from each other, on a top surface of a base substrate;
    forming a neutral layer, which includes a random copolymer comprising first blocks or second blocks, after the forming guide layer patterns, on an entirety of the top surface of the base substrate exposed between the guide layer patterns;
    forming hydrophobic layer patterns which extend from top surfaces of the guide layer patterns to side surfaces of the guide layer patterns and are separated from each other;
    coating a block copolymer, which comprises third blocks and fourth blocks, on a top surface of the neutral layer exposed between the hydrophobic layer patterns;
    alternately arranging the third blocks of the block copolymer and the fourth blocks of the block copolymer by heat-treating or solvent-annealing the block copolymer; and
    forming block copolymer patterns by removing the third blocks of the block copolymer or the fourth blocks of the block copolymer,
    wherein the neutral layer contacts a side surface of the guide layer patterns and the top surface of the base substrate,
    wherein a thickness of the guide layer patterns from the top surface of the base substrate is greater than a thickness of the neutral layer from the top surface of the base substrate, and
    wherein the first blocks are identical to the third blocks and the second blocks are identical to the fourth blocks.

2. The patterning method of claim 1, wherein the forming the guide layer patterns comprises:
    forming a stacked structure including the base substrate, a guide layer, a metal layer, and a sacrificial layer stacked sequentially;
    forming a photoresist layer by coating photoresist on the sacrificial layer and forming photoresist patterns which are separated from each other by exposing and developing the photoresist layer;
    exposing the metal layer and forming sacrificial layer patterns which are separated from each other by partially removing the sacrificial layer using the photoresist patterns as a mask;
    forming an auxiliary guide layer unitarily disposed on top and side surfaces of the sacrificial layer patterns and a top surface of the metal layer after removing the photoresist patterns;
    forming auxiliary guide patterns which are separated from each other by removing the auxiliary guide layer from the top surfaces of the sacrificial layer patterns and the top surface of the metal layer and then removing the sacrificial layer patterns; and
    exposing the base substrate and forming the guide layer patterns which are separated from each other by sequentially removing the metal layer and the guide layer using the auxiliary guide layer patterns as a mask.

3. The patterning method of claim 1, wherein the forming the neutral layer comprises:
    overcoating the random copolymer on the top surface of the base substrate;
    baking the overcoated random copolymer; and
    partially removing the overcoated random polymer and entirely exposing the top surfaces of the guide layer patterns and partially exposing the side surfaces of the guide layer patterns by performing an oxygen ($O_2$) plasma ashing process and then a wash-out process.

4. The patterning method of claim 1, wherein the forming the hydrophobic layer patterns comprises:
    forming a hydrophobic layer by coating a fluorine-based hydrophobic material on the top and side surfaces of the guide layer patterns and the top surface of the neutral layer;
    baking the hydrophobic layer; and
    exposing the top surface of the neutral layer by partially removing the hydrophobic layer using a wash-out process.

5. The patterning method of claim 1, wherein the random copolymer includes at least one of poly(styrene-r-methylmethacrylate) (PS-r-PMMA), poly(styrene-r-butadiene) (PS-r-PB), poly(styrene-r-isoprene) (PS-r-PI), poly(styrene-r-ethylene) (PS-r-PE), poly(styrene-r-ethyleneoxide) (PS-r-PEO), poly(styrene-r-ferrocenyldimethylsilane) (PS-r-PFS), poly(styrene-r-(2-vinylpyridine)) (PS-r-P2VP), and poly(styrene-r-dimethylsiloxane) (PS-r-PDMS).

6. The patterning method of claim 5, wherein an end of the random copolymer is protected by one reaction group including at least one of a hydroxyl group, an alkoxy group, and a chlorine group.

7. The patterning method of claim 1, wherein the hydrophobic layer patterns include a fluorine-based hydrophobic material, wherein the fluorine-based hydrophobic material comprises at least one of a fluorine-based polymer and a fluorine-based monomer and polydimethylsiloxane.

8. The patterning method of claim 7, wherein an end of the fluorine-based hydrophobic material is protected by one reaction group including at least one of a hydroxyl group, an alkoxy group, and a chlorine group.

9. The patterning method of claim 1, wherein the block copolymer includes at least one of poly(styrene-b-methylmethacrylate) (PS-b-PMMA), poly(styrene-b-butadiene) (PS-b-PB), poly(styrene-b-isoprene) (PS-b-PI), poly(styrene-b-ethylene) (PS-b-PE), poly(styrene-b-ethyleneoxide) (PS-b-PEO), poly(styrene-b-ferrocenyldimethylsilane) (PS-b-PFS), poly(styrene-b-(2-vinylpyridine)) (PS-b-P2VP), and poly(styrene-b-dimethylsiloxane) (PS-b-PDMS).

10. The patterning method of claim 1, wherein the base substrate includes at least one of silicon oxide ($SiO_2$), silicon nitride (SiNx), and metal.

* * * * *